(12) United States Patent
Ueno et al.

(10) Patent No.: US 6,522,175 B2
(45) Date of Patent: Feb. 18, 2003

(54) CURRENT/VOLTAGE CONVERTER AND D/A CONVERTER

(75) Inventors: Masayuki Ueno, Chiba (JP); Masatoshi Takada, Chiba (JP); Chie Serizawa, Kokubunji (JP)

(73) Assignee: Kawasaki Microelectronics Inc., Chiba (JP)

( * ) Notice: Subject to any disclaimer, the term of this patent is extended or adjusted under 35 U.S.C. 154(b) by 0 days.

(21) Appl. No.: 09/971,596

(22) Filed: Oct. 9, 2001

(65) Prior Publication Data

US 2002/0053929 A1 May 9, 2002

(30) Foreign Application Priority Data

Oct. 10, 2000 (JP) ........................................ 2000-308882

(51) Int. Cl.[7] .............................................. H02M 11/00
(52) U.S. Cl. ........................ 327/103; 327/538; 341/144; 323/312
(58) Field of Search ................................. 327/100, 103, 327/535, 538, 94, 419, 427; 341/126, 127, 144–147, 154; 323/311–315

(56) References Cited

U.S. PATENT DOCUMENTS

| | | | | |
|---|---|---|---|---|
| 4,982,192 A | * | 1/1991 | Murooka | ..................... 341/127 |
| 5,694,033 A | * | 12/1997 | Wei et al. | ..................... 323/315 |
| 6,002,354 A | * | 12/1999 | Itoh et al. | ..................... 341/144 |
| 6,369,618 B1 | * | 4/2002 | Bloodworth et al. | ....... 327/103 |

* cited by examiner

*Primary Examiner*—Minh Nguyen
(74) *Attorney, Agent, or Firm*—Oliff & Berridge, PLC

(57) ABSTRACT

A current/voltage converter includes a current source connected to a first node; a first transistor element connected between the first node and a power supply or ground; a second transistor element which is connected between a second node and the power supply or ground, whose control terminal is connected to that of the first transistor element; a first control circuit which controls the voltages of control terminals of the first and second transistor elements so that the voltage of the first node becomes substantially equal to that of a bias voltage as one of inputs to the first control circuit; a second control circuit controlling the voltage of the second node so as to become substantially equal to that of the first node; and a resistance element one end of which is connected to the second node, and which converts the current flowing through the second transistor element into a voltage.

30 Claims, 7 Drawing Sheets

CURRENT/VOLTAGE CONVERTER AND D/A CONVERTER

BACKGROUND OF THE INVENTION

1. Field of the Invention

The present invention relates to a current/voltage converter which converts a current supplied from a current source into a voltage, a current/voltage converter which converts the total current supplied from the current source supplying the current value corresponding to a digital signal, into a voltage, and relates to a D/A converter using the same.

2. Description of the Related Art

FIG. 3A is a simplified circuit diagram of an example of a current-cell type D/A converter 30.

Since an example of two-bit D/A converter will suffice for explaining the principle of current/voltage conversion, a two-bit D/A converter will be described hereinafter for simplification. However, the same goes with a n-bit converter.

The current-cell type D/A converter (hereinafter abbreviated as a "DAC") 30 shown in FIG. 3A comprises three current sources 32, 34, and 36 which feed respective currents Is1, Is2, and Is3; three changeover switches 38, 40, and 42 provided corresponding to these current sources 32, 34, and 36, respectively; and a resistance element 44 (resistance value: R) for current/voltage (or referred to as I/V, hereinafter) conversion. Herein, Is1=Is2=Is3.

The current source 32 is connected between the power supply and the changeover switch 38, and likewise, the current source 34 is connected between the power supply and the changeover switch 40, and the current source 36 is connected between the power supply and the changeover switch 42. Each of the changeover switches 38, 40, and 42 is connected so as to switch between the current source and the ground or an analog signal node Vout. The resistance element 44 is connected between the analog signal node Vout and the ground.

In the illustrated DAC 30, each of the changeover switches 38, 40, and 42 is connected to either the node Vout side or the ground side, in response to a digital signal (not shown) inputted to the DAC 30.

For example, when the digital signal is "00", all changeover switches 38, 40, and 42 are connected to the ground side, and when the digital signal is "01", the changeover switch 38 is connected to the node Vout side while the changeover switches 40 and 42 are connected to the ground side. Also, when the digital signal is "10", the changeover switches 38 and 40 are connected to the node Vout side while the changeover switch 42 is connected to the ground side, and when the digital signal is "11", all changeover switches 38, 40, and 42 are connected to the node Vout side.

Each of the current Is1, Is2, and Is3 supplied from the respective current sources 32, 34, and 36 flows to either the node Vout side or the ground side in accordance with the setting of the changeover switches, as described above. The total current Isig composed of the currents flowing from the current sources 32, 34, and 36 to the node Vout side via the respective changeover switches 38, 40, and 42 is I/V converted by the resistance element 44, and outputted as an analog signal vout=R·Isig, as shown in FIG. 3A.

As shown in FIG. 3A, each of the current sources 32, 34, and 36 is constituted of, for example, a P-type MOS transistor (hereinafter abbreviated as PMOS) or the like. As shown in FIG. 3C, however, the current Is supplied via a PMOS gradually decreases as the voltage Vds between the source and drain of the PMOS decreases. As a result, in FIG. 3B, the voltage of the analog signal Vout increases in a manner such that the voltage b1>b2>b3, although the voltage of the analog signal Vout should essentially increase in a manner such that b1=b2=b3. This raises a problem in that linearity failure of the DAC occurs.

Meanwhile, the minimum value of the analog signal Vout outputted from the DAC 30 shown in FIG. 3A is 0 V. However, unless the output of the analog signal Vout is shifted in response to the input-output characteristic of the poststage circuit utilizing this analog signal vout, the analog signal Vout cannot be used for the poststage circuit. It is therefore necessary to level-shift the analog signal Vout of the DAC 30 into the range of the optimum input voltages of the poststage circuit, the range being indicated by an double-headed arrow in FIG. 4A.

FIGS. 4B, 4C and 4D are each circuit diagrams of examples of conventional level shift circuits.

First, a level shift circuit 50 in FIG. 4B is arranged to utilize a source follower configuration, and comprises two PMOSs 52 and 54. The PMOS 52 is connected between a power supply and an analog signal node Vout, and a bias voltage Vb is inputted to the gate thereof. On the other hand, the PMOS 54 is connected between the analog signal node Vout and the ground, and a signal IN is inputted to the gate thereof. As the signal IN, for example, the analog signal node Vout of the DAC 30 shown in FIG. 3A is inputted.

In the illustrated level shift circuit 50, the PMOS 52 supplies a current in response to the bias voltage Vb to the analog signal node Vout side, while the PMOS 54 feeds the current in response to the voltage of the signal IN to the ground side. Thereby, as the voltage of the signal IN increases, the voltage of the analog signal node Vout rises.

However, the level shift circuit 50 utilizing the source follower configuration involve a problem of inherently having an inferior linearity.

Next, a level shift circuit 56 shown in FIG. 4C is arranged to add a bias current Ib to the above-described total current Isig, and to I/V convert this summed current. The level shift circuit 56 comprises a current source 58 which feeds the current corresponding to the total current Isig which flows to the analog output node Vout side of the DAC 30; a current source 60 for use in the bias current Ib; and a resistance element 62. Each of the current sources 58 and 60 is connected between the power supply and the analog signal node Vout, and the resistance element 62 is connected between the node Vout and the ground.

In this level shift circuit 56, the total current Isig and the bias current Ib are summed up, and this summed current (Isig+Ib) is I/V converted by the resistance element 62, and outputted as an analog signal Vout=(Isig+Ib)·R.

In this level shift circuit 56 utilizing the bias current Ib, however, when the potential of the analog signal Vout is increased by R·Ib, the amplitude of the Vds of the PMOSs of the current sources 32, 34, and 36 in FIG. 3A is correspondingly reduced. This raises a problem in that the output amplitude decreases.

Then, a level shift circuit 64 shown in FIG. 4D is arranged to utilize an operational amplifier, and comprises a current source 66 which feeds the current corresponding to the total current Isig which flows to the analog output node Vout side of the DAC 30; an operational amplifier 68; and a resistance element 70. The current sources 66 is connected between the power supply and the negative input terminal of the operational amplifier 68. The positive input terminal of the operational amplifier 68 is connected to the ground, and the resistance element 70 is connected between the negative input terminal of the operational amplifier 68 and the output terminal (analog signal Vout).

In this level shift circuit 64, the analog signal becomes Vout=−R·Isig. That is, the polarity of the analog signal Vout is inverted. This creates a problem in that a wide range of power supply voltage is required in order to secure the amplitude of analog signal Vout.

SUMMARY OF THE INVENTION

Accordingly, it is an object of the present invention to solve the problems caused by the above-described conventional arts and to provide a current/voltage converter and a D/A converter using this which are capable of eliminating linearity failure, and which can level-shift the potential of an analog signal in response to the input-output characteristic of the poststage circuit.

In order to achieve the above-described object, the present invention provides an I/V converter, comprising a current source connected to a first node; a first transistor element connected between the first node and a power supply or the ground; a second transistor element which is connected between a second node and the power supply or the ground, of which the control terminal is connected to that of the first transistor element, and which is of the same conductive type as the first transistor element; a first control circuit which uses a bias voltage as one of the inputs thereto, and which controls the voltages of the control terminals of the first and second transistor elements so that the voltage of the first node becomes substantially equal to the bias voltage; a second control circuit which uses the bias voltage as one of the inputs thereto, and which controls voltage of the second node so as to become substantially equal to that of the first node; and a resistance element one end of which is connected to the second node, and which converts the current flowing through the second transistor element into a voltage.

Herein, since the control terminals of the first and second transistor elements are controlled so as to have a common potential, and one-side ends thereof are both connected to the power supply or the ground potential, mutually equal currents flow through these two transistor elements by the current mirror effect when the sizes thereof are equal.

The transistor elements in the present invention may be MOS transistors or bipolar transistors. In order to generate the current mirror effect, however, it is necessary to use the same type of transistors. In a MOS transistor, the control terminal thereof is a gate terminal, while in a bipolar transistor, the control terminal is a base terminal. The size of a MOS transistor is determined by the gate length and gate width thereof, while that of bipolar transistor is determined by the junction area between the base and emitter thereof. In the present invention, however, the sizes of transistor elements are not limited.

Herein, it is preferable that each of the first and second control circuits be an operational amplifier.

Preferably, the above-described I/V converter further has means for changing the value of the aforementioned bias voltage.

Moreover, the present invention provides a D/A converter comprising a current generating circuit which generates the total current corresponding to the digital signal to be converted into an analog signal; and the above-described I/V converter wherein a current is supplied from the above-mentioned current generating circuit to the first node thereof.

Preferably, the above-described D/A converter further has a bias current supplying circuit capable of adjusting the current which is supplied from the above-described current generating circuit to the first node.

The above and other objects, features, and advantages of the present invention will be clear from the following detailed description of the preferred embodiments of the invention in conjunction with the accompanying drawings.

DESCRIPTION OF THE PREFERRED EMBODIMENTS

Figure 1A:
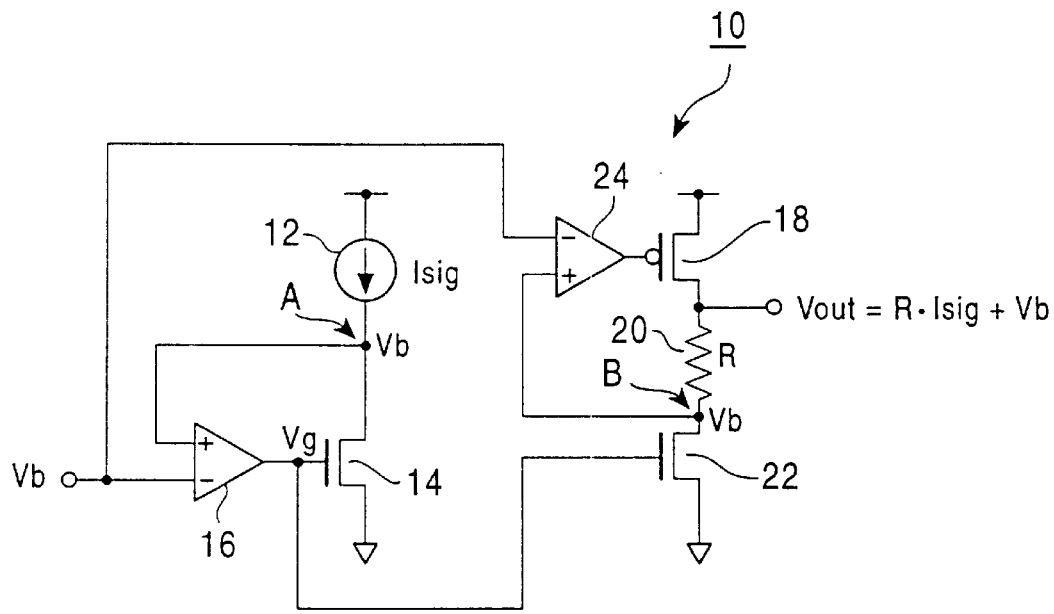
FIG. 1A is a circuit diagram of a current/voltage converter in accordance with an embodiment of the present invention.

FIG. 1A is a circuit diagram of an I/V converter 10 in accordance with an embodiment of the present invention.

The I/V converter 10 shown in FIG. 1A comprises a N-type transistor (NMOS) 14 and an operational amplifier (hereinafter abbreviated as an "OP") 16 provided on the left side in the figure; and a P-type transistor (PMOS) 18, a resistance element 20 (resistance value: R), a NMOS 22, and an OP 24 provided on the right side in the figure.

Herein, the NMOSs 14 and 22 each constitute examples of the first and second transistor elements of the present invention. Likewise, the OPs 16 and 24 each constitute examples of the first and second control circuits, nodes A and B each constitute examples of the first and second nodes of the present invention, and the PMOS 18 constitutes an example of the third transistor element of the present invention.

The current source 12 shown in the figure is connected between the power supply and the NMOS 14, and supplies a current value Isig.

The NMOS 14 is connected between the current source 12 and the ground, and an output signal from the OP 16 is inputted to the gate of this NMOS 14. The output signal from the OP 16 is also inputted to the gate of the NMOS 22 on the right side in the figure. To the positive terminal of the OP 16, the node A constituting the connection point between the current source 12 and the NMOS 14 is connected, while to the negative terminal of the OP 16, a bias voltage Vb is inputted. The bias voltage Vb may be provided by any device that is capable of providing and varying a voltage.

On the other hand, the PMOS 18 on the right side in the figure is connected between the power supply and the analog signal node Vout, and an output signal from the OP 24 is inputted to the gate of this PMOS 18. To the positive terminal of the OP 24, the node B constituting the connection point between the resistance element 20 and the NMOS 22 is connected, while to the negative terminal of the OP 24, a bias voltage Vb is inputted. The resistance element 20 is connected between the analog signal node Vout and the NMOS 22, and the NMOS 22 is connected between the resistance element 20 and the ground.

In the illustrated I/V converter 10, therefore, the voltage Vg of the output signal of the OP 16 varies so that the voltages of the positive and negative input terminals of the OP 16 agree with each other, or in other words, so that the voltage of the node A becomes equal to the bias voltage Vb irrespective of the current Isig.

In this manner, in the I/V conversion circuitry 10 in accordance with the present invention, the voltage of the node A, that is, the voltage Vds between the source and drain of the PMOS which is a current source in the I/V converter of the present invention, is controlled so as to be always constant, so that linearity failure of the DAC can be eliminated.

In the illustrated I/V converter 10, the NMOSs 14 and 22 constitute a pair of current mirror transistors. The node B, therefore, is controlled by the OP 24 so as to have a voltage equal to that of the node A, that is, so as to have the constant voltage equal to the bias voltage Vb. The node B is supplied with the current Isig by current-mirroring, then the current Isig is I/V converted by the resistance element 20, and when the sizes of the NMOSs 14 and 22 are equal, the analog signal Vout is outputted as Vout=R·Isig+Vb. When the NMOS 22 is n-times the size of the NMOS 14, the analog signal Vout is outputted as Vout=n·R·Isig+Vb.

Next, an I/V converter 10' in accordance with another embodiment of the present invention will be described with reference to FIG. 1B. The I/V converter 10' shown in the figure is constituted by replacing the NMOSs in the I/V converter in FIG. 1A with PMOSs, then by replacing the PMOSs therein with a NMOSs, and by interchanging the positions of the power supply and the ground therein. Corresponding elements, therefore, are designated by the same reference characters with a prime affixed. With regard to circuit operation also, this I/V converter 10' is similar to the above-described I/V converter 10, and therefore, the circuit operation thereof will be omitted from description. In the I/V converter 10', the sizes of the PMOSs 14' and 22' are equal, the analog signal Vout' is outputted as Vout'=Vb'−R'·Isig'.

Next, an I/V converter 15 in accordance with still another embodiment of the present invention and a D/A converter using this will be described with reference to FIG. 2A. The I/V converter 15 differs from the I/V converter 10 in FIG. 1A only in that the I/V converter 15 uses a current generating circuit which generates the current corresponding to the digital signal to be converted into an analog signal, instead of the current source in the I/V converter 10, and that the I/V converter 15 has a current source 13 although The current generating circuit 12 shown in the figure, which is a current generating circuit which generates the current corresponding to the digital signal to be converted into an analog signal in the D/A converter in accordance with the present invention, is connected between the power supply and the NMOS 14, and supplies the total current Isig. The current source 13 shown in the figure is a bias current supplying means which can adjust the current supplied from the current generating circuit 12 to the node A, and connected between the power supply and the NMOS 14 as in the case of the current generating circuit 12. This current source 13 supplies a bias current Ib to the node A, and adjusts an overall current supplied to the node A. Herein, it is not an essential condition for the D/A converter in accordance with the present invention to have the current source 13, but it is preferable to have it like the embodiment shown in FIG. 2A.

The total current Isig supplied from the current source 12 varies in response to the digital signal to be converted into an analog signal by the D/A converter in accordance with the present invention.

In the I/V conversion circuitry 15, the voltage Vg of the output signal of the OP 16 varies so that the voltages of the positive input terminal and the negative input terminal of the OP 16 agree with each other, or in other words, so that the voltage of the node A becomes equal to the bias voltage Vb irrespective of the current Isig.

Figure 3A:
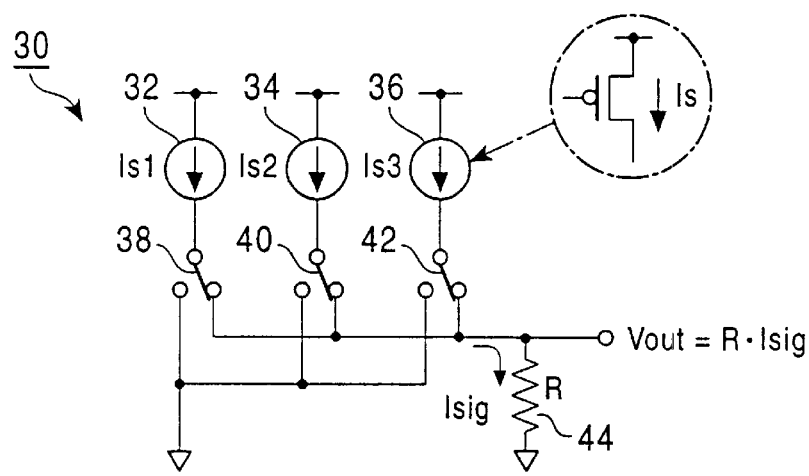
FIG. 3A is a simplified circuit diagram of an example of a conventional current-cell type D/A converter.
Figure 3B:
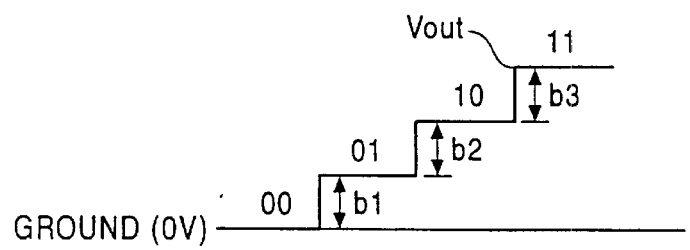
FIG. 3B is a timing chart showing the operation of the current-cell type D/A converter shown in FIG. 3A.
Figure 3C:
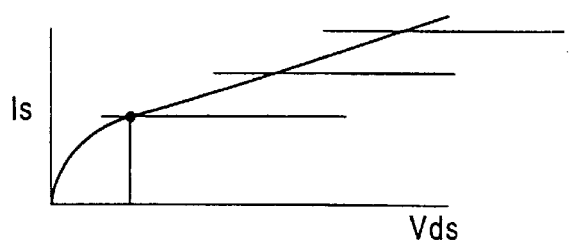
FIG. 3C is a diagram showing an example of the Is—Vds characteristic.
Figure 4A:
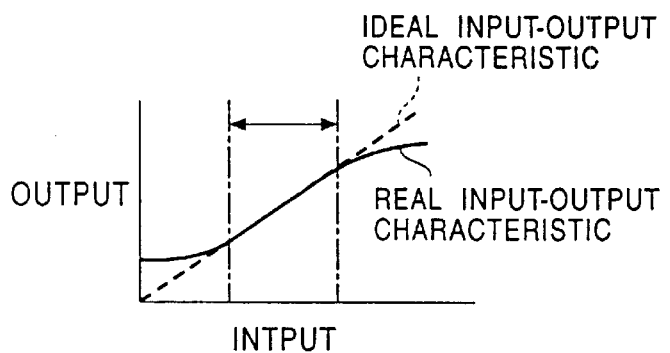
FIG. 4A is an example of the relationship between an output of the D/A converter and the input of the next stage circuit.
Figure 4B:
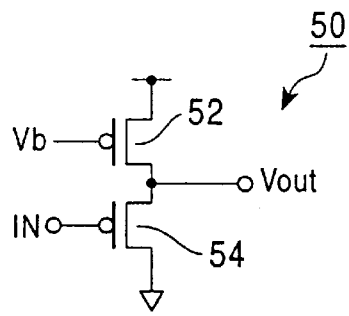
FIGS. 4B, 4C and 4D are each circuit diagrams of examples of conventional level shift circuits.
Figure 4C:
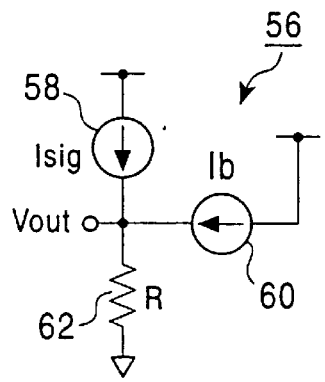
Figure 4D:
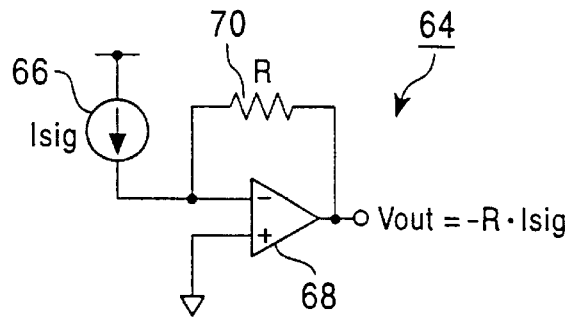

In this manner, in the I/V conversion circuitry 15 in accordance with the present invention, the voltage of the node A, that is, the voltage Vds between the source and drain of the current source 12 which supplies the total current in response to a digital signal in the D/A converter of the present invention, for example, the voltage Vds between the source and drain of the PMOS which is a current source in the D/A converter 30 in FIG. 3A, is controlled so as to be always constant. This allows linearity failure of the DAC to be eliminated.

In the I/V conversion circuitry 15, the NMOSs 14 and 22 constitute a pair of current mirror transistors. The node B, therefore, is controlled by the OP 24 so as to have a voltage equal to that of the node A, that is, the constant voltage equal to the bias voltage Vb. The node B is supplied with the total current Isig by current-mirroring, then the total current Isig is I/V converted by the resistance element 20, and when the sizes of the NMOSs 14 and 22 are equal, and the current source 13 is provided as shown in FIG. 2A, the analog signal is outputted as Vout=R·(Isig+Ib)+Vb.

That is, in the I/V conversion circuitry 15, the voltage level of the analog signal Vout is clamped to the voltage of the bias voltage Vb. Therefore, by appropriately setting the bias voltage Vb in response to the input-output characteristic of the poststage circuit utilizing the analog signal Vout of the D/A converter, the output level of the analog signal Vout can be shifted, and thereby facilitating the transmission of the analog signal Vout to the poststage circuit.

Figure 2A:
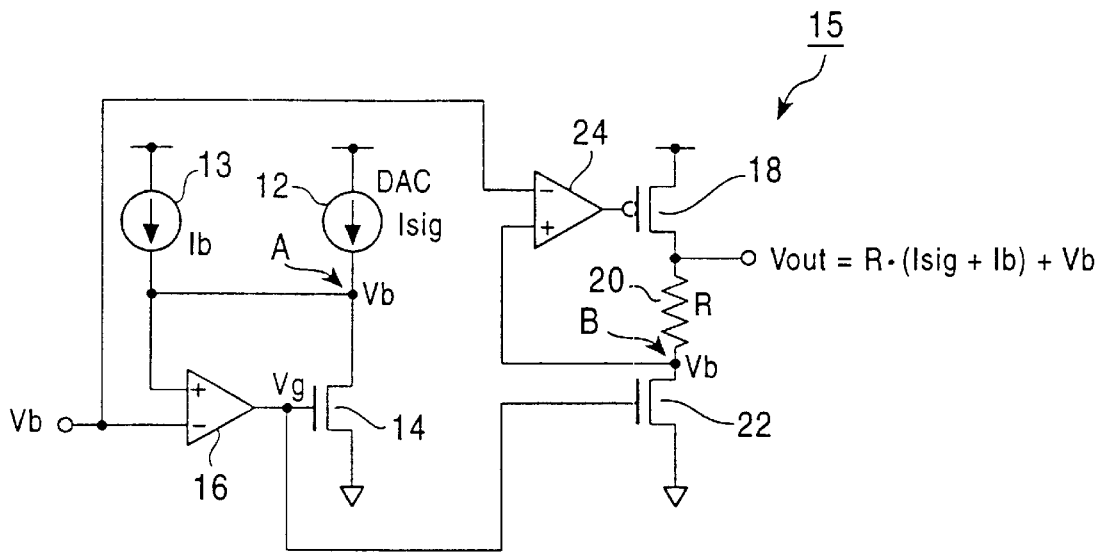
FIG. 2A is a circuit diagram of a current/voltage converter in accordance with still another embodiment of the present invention, and a D/A converter using this.
Figure 2B:
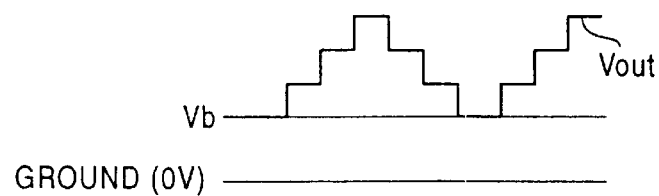
FIG. 2B is diagram illustrating an example of output waveform of the D/A converter shown in FIG. 2A.

In the embodiment shown in FIG. 2A, a specific example is illustrated for implementing the I/V conversion circuitry 15 in accordance with the present invention and the D/A converter using this, by employing the NMOSs 14 and 22 as the current mirror circuit, and the OPs 16 and 24 as the first and second control circuits. However, the present invention is not limited to this embodiment, but the I/V converter in accordance with the present invention and the D/A converter using this may be realized by using other means for implementing the same function.

Figure 2C:
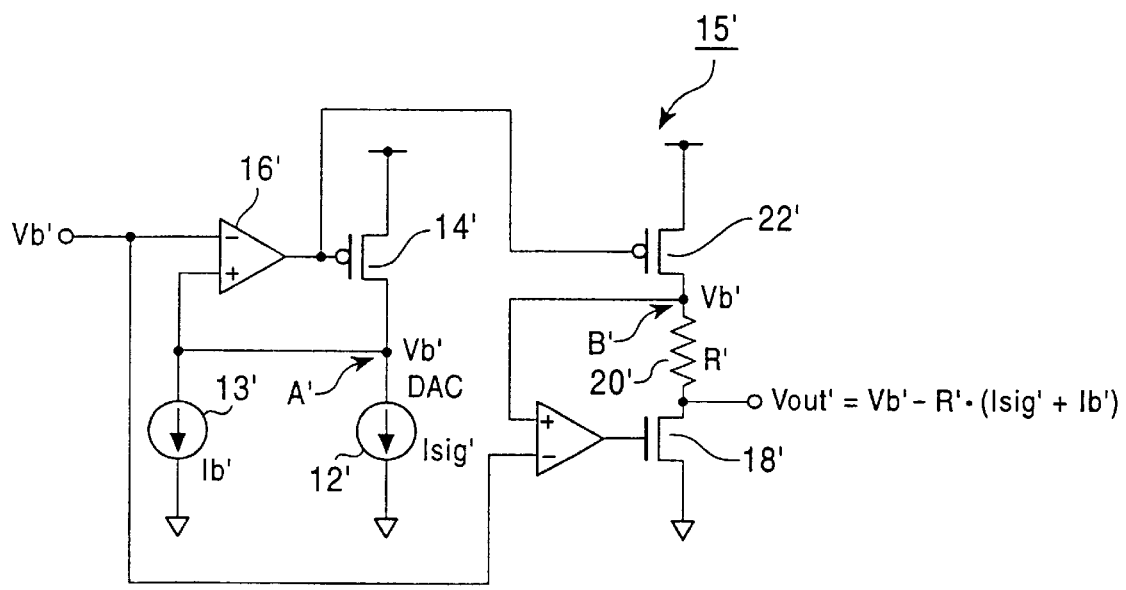
FIG. 2C is a circuit diagram of a current/voltage converter in accordance with a further embodiment of the present invention, and a D/A converter using this.

As another embodiment, one wherein, in the circuit in FIG. 2A, NMOSs are replaced with PMOSs, PMOSs are replaced with NMOSs, and wherein the positions of the power supply and the ground is interchanged, is shown in FIG. 2C. Corresponding elements are designated by the same reference characters with a prime affixed. The operation of this embodiment is similar to that of the embodiment shown in FIG. 2A, the operation thereof will be omitted from description.

Figure 1B:
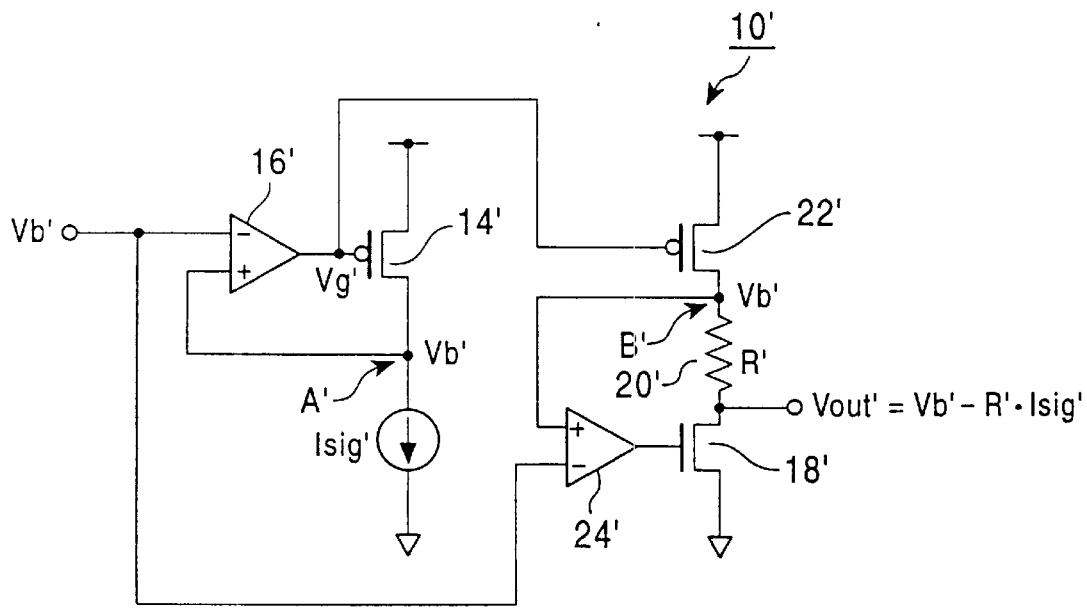
FIG. 1B is a circuit diagram of a current/voltage converter in accordance with another embodiment of the present invention.
Figure 1C:
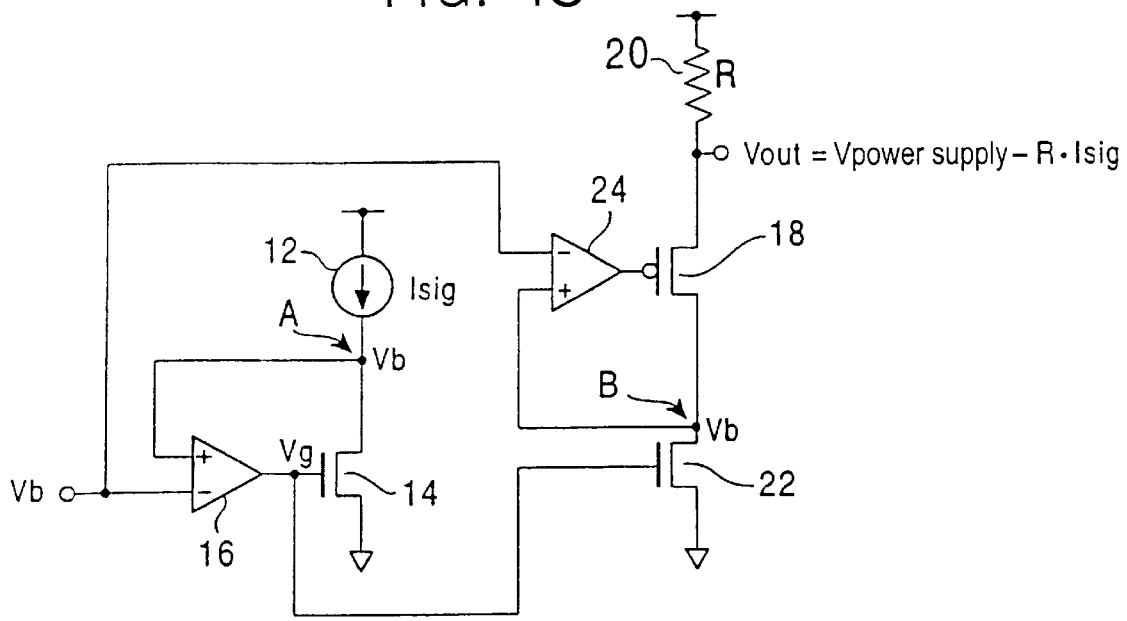
FIG. 1C is a circuit diagram of a current/voltage converter in accordance with another embodiment of the present invention.
Figure 2D:
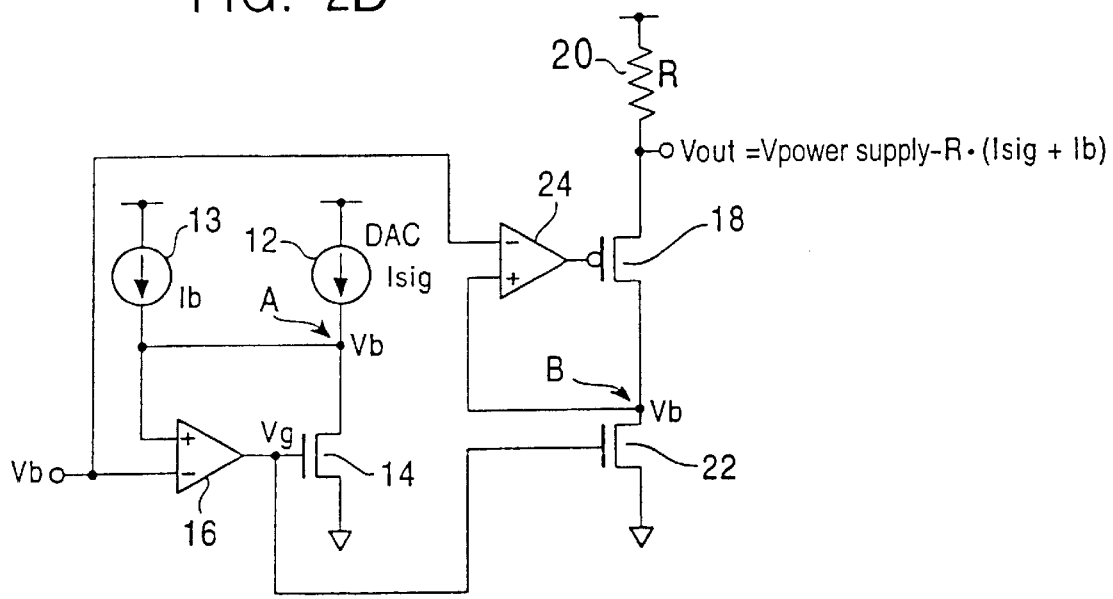
FIG. 2D is a circuit diagram of a current/voltage converter in accordance with another embodiment of the present invention.

As a further embodiment shown in FIGS. 1C and 2D, a configuration may be adopted wherein, in the I/V converter in FIGS. 1A and 2A, the connection position between the PMOS 18 and the resistance 20 is changed so that the resistance element 20 is connected between the power supply and the analog output node Vout, and that the PMOS 18 is connected between the node Vout and the second node B.

Figure 1D:
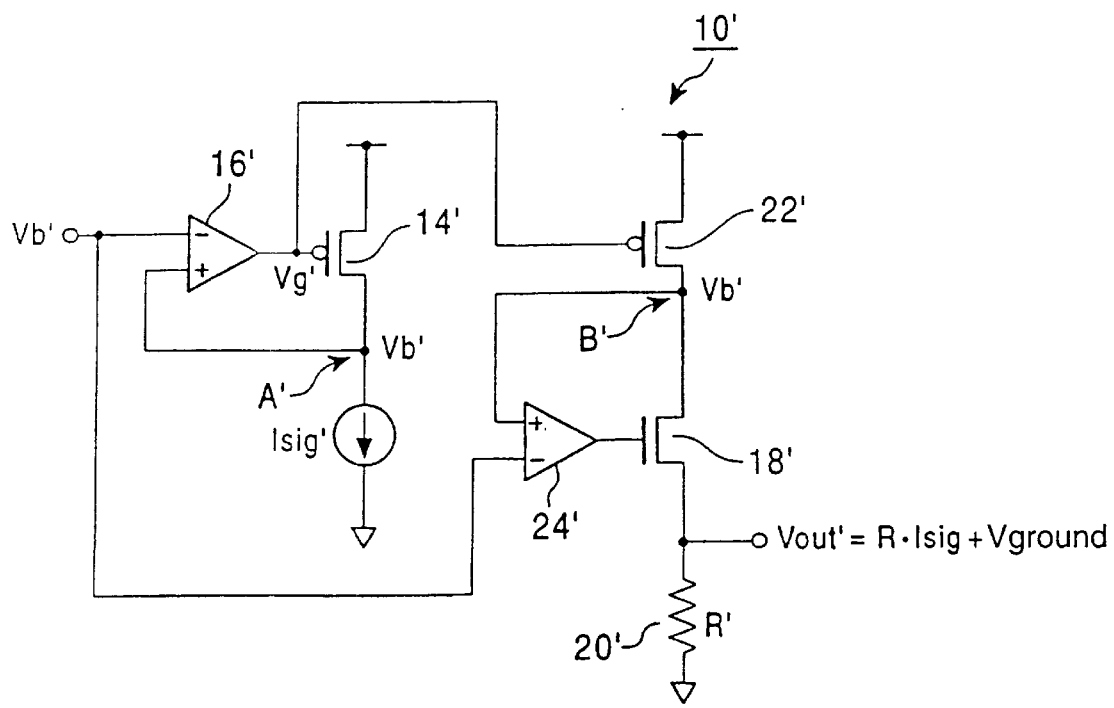
FIG. 1D is a circuit diagram of a current/voltage converter in accordance with another embodiment of the present invention.
Figure 2E:
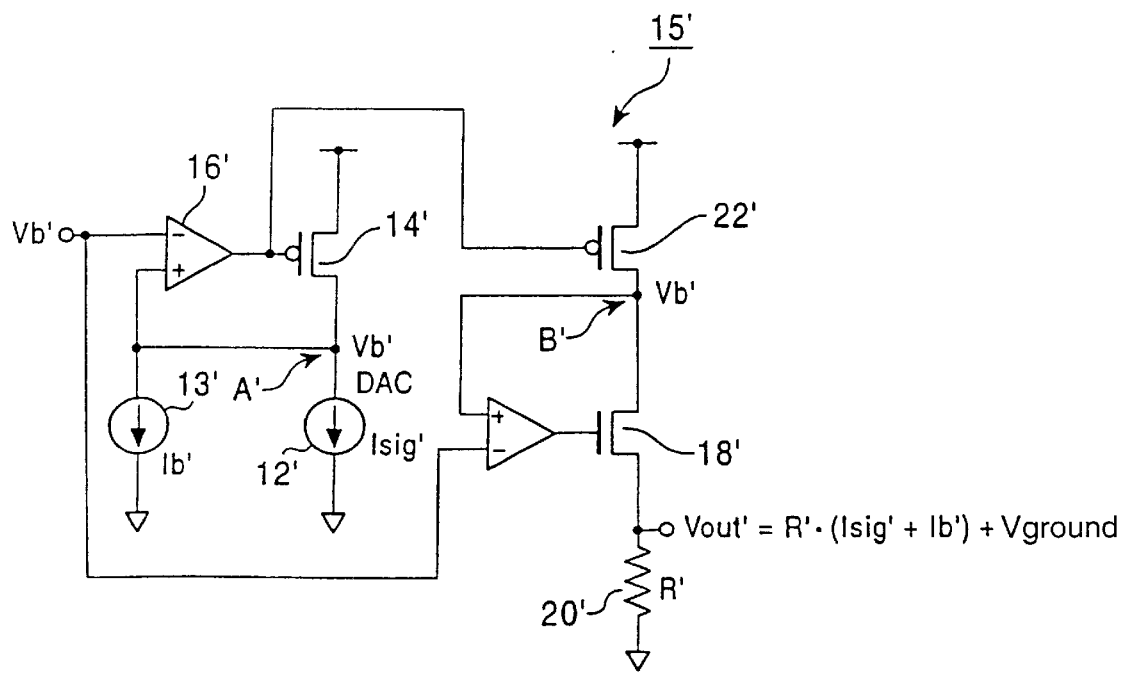
FIG. 2E is a circuit diagram of a current/voltage converter in accordance with another embodiment of the present invention.

Alternatively, as shown in FIGS. 1D and 2E, a configuration may be adopted wherein, in the I/V converter in FIGS. 1B and 2C, the connection position between the NMOS 18' and the resistance element 20' is changed so that the resistance element 20' is connected between the ground and the analog output node Vout', and that the NMOS 18' is connected between the node Vout' and the second node B'.

In the present invention, the transistor elements which constitute a pair of current mirror transistors are not limited to MOS transistors, but bipolar transistors can also be used as the transistor elements which constitute a pair of current mirror transistors.

The D/A converter in accordance with the present invention is arranged so that the I/V converters of the present invention shown in FIGS. 2A and 2C are each used for the output stage of the D/A converter. More specifically, the D/A converter in accordance with the present invention is one wherein, in the conventional current-cell type DAC shown in FIG. 3A, each of the I/V converters 15 and 15' shown in FIGS. 2A and 2C, respectively, in accordance with the present invention, is used in place of the resistance element 44. As a current generating circuit, any that can generate the total current corresponding to the digital signal to be converted into an analog signal can be employed, even if it is a known current generating circuit.

While the I/V converter in accordance with the present invention and the D/A converter using this have been described in detail, the present invention is not restricted to the above-described embodiments, but various changes and modifications may be made thereto without departing from the true spirit and scope of the invention.

As is evident from the foregoing, in accordance with the present invention, since the voltage of the first node, for example, the voltage between the source and drain of the MOS transistor constituting the current source of the DAC is fixed at a fixed voltage, linearity failure of the DAC can be eliminated. In addition, by appropriately changing the setting of a bias voltage, and by shifting the output level of an analog signal in response to the input-output characteristic of the poststage circuit which utilizes the analog signal of the DAC, the transmission of the analog signal to the poststage circuit can be facilitated.

What is claimed is:

1. A current/voltage conversion circuitry, comprising:
a current source connected to a first node;
a first transistor element connected between the first node and a first potential voltage;
a second transistor element which is connected between a second node and the first potential voltage, of which a control terminal is connected to that of the first transistor element, and which is of a same conductive type as the first transistor element;
a first control circuit which uses a bias voltage as one of inputs thereto, and which controls voltages of the control terminals of said first and second transistor elements so that a voltage of said first node becomes substantially equal to said bias voltage;
a second control circuit which uses said bias voltage as one of inputs thereto, and which controls a voltage of said second node so as to become substantially equal to that of said first node; and
a resistance element, connected to the second control circuit, one end of which is connected to said second node, and which converts a current flowing through said second transistor element into a voltage.

2. A current/voltage conversion circuitry in accordance with claim 1, further comprising a third transistor element which is connected between a second potential voltage and the other end of said resistance element, and which performs a function of controlling the voltage of said second node so as to become substantially equal to the voltage of said first node by a voltage of a control terminal of said third transistor element being controlled by the second control circuit.

3. A current/voltage conversion circuitry in accordance with claim 2, wherein each of said first and second control circuits is an operational amplifier.

4. A current/voltage conversion circuitry in accordance with claim 3, further comprising means for varying a value of said bias voltage.

5. A current/voltage conversion circuitry in accordance with claim 3, wherein:
said first transistor element is a N-type MOS transistor;
said second transistor element is a N-type MOS transitor; and
said third transistor element is a P-type MOS transistor.

6. A current/voltage conversion circuitry in accordance with claim 3, wherein:
said first transistor element is a P-type MOS transistor;
said second transistor element is a P-type MOS transistor; and
said third transistor element is a N-type MOS transistor.

7. A current/voltage conversion circuitry in accordance with claim 3, wherein:
said first transistor element is an npn bipolar transistor;
said second transistor element is an npn bipolar transistor; and
said third transistor element is a pnp bipolar transistor.

8. A current/voltage conversion circuitry in accordance with claim 3, wherein:
said first transistor element is a pnp bipolar transistor;
said second transistor element is a pnp bipolar transistor; and
said third transistor element is an npn bipolar transistor.

9. A current/voltage conversion circuitry in accordance with claim 2, wherein the first potential voltage is a power supply and the second potential voltage is a ground.

10. A current/voltage conversion circuitry in accordance with claim 2, wherein the first potential voltage is a ground and the second potential voltage is a power supply.

11. A current/voltage conversion circuitry in accordance with claim 1, wherein the first potential voltage is a power supply.

12. A current/voltage conversion circuitry in accordance with claim 1, wherein the first potential voltage is a ground.

13. A D/A converter, comprising:
a current generating circuit which is connected to a first node, and which generates a current corresponding to a digital signal;
a first transistor element connected between the first node and a first potential voltage;
a second transistor element which is connected between a second node and the first potential voltage, of which a control terminal is connected to that of the first transistor element, and which is of a same conductive type as the first transistor element;
a first control circuit which uses a bias voltage as one of inputs thereto, and which controls voltages of the control terminals of said first and second transistor elements so that a voltage of said first node becomes substantially equal to said bias voltage;
a second control circuit which uses said bias voltage as one of inputs thereto, and which controls a voltage of said second node so as to become substantially equal to that of said first node; and
a resistance element, connected to the second control circuit, one end of which is connected to said second node, and which converts a current flowing through said second transistor element into a voltage.

14. A D/A converter in accordance with claim 13, further comprising a third transistor element which is connected between a second potential voltage and the other end of said resistance element, and which performs a function of controlling the voltage of said second node so as to become substantially equal to the voltage of said first node, by a voltage of a control terminal of said third transistor element being controlled by the second control circuit.

15. A D/A converter in accordance with claim 14, wherein each of said first and second control circuits is an operational amplifier.

16. A D/A converter in accordance with claim 15, further comprising means for varying a value of said bias voltage.

17. A D/A converter in accordance with claim 16, further comprising a bias current supplying circuit capable of adjusting the current which is supplied from said current generating circuit to said first node.

18. A D/A convener in accordance with claim 14, wherein:
said first transistor element is a N-type MOS transistor,
said second transistor element is a N-type MOS transistor; and
said third transistor element is a P-type MOS transistor.

19. A D/A converter in accordance with claim 14, wherein:
said first transistor element is a P-type MOS transistor;
said second transistor element is a P-type MOS transistor; and
said third transistor element is a N-type MOS transistor.

20. A D/A converter in accordance with claim 14, wherein:
said first transistor element is an npn bipolar transistor;
said second transistor element is an npn bipolar transistor; and
said third transistor element is a pnp bipolar transistor.

21. A D/A converter in accordance with claim 14, wherein;
said first transistor element is a pnp bipolar transistor;
said second transistor element is a pnp bipolar transistor; and
said third transistor element is an npn bipolar transistor.

22. A D/A converter in accordance with claim 14, wherein the first potential voltage is a power supply and the second potential voltage is a ground.

23. A D/A converter in accordance with claim 14, wherein the first potential voltage is a ground and the second potential voltage is a power supply.

24. A D/A converter in accordance with claim 13, wherein the first potential voltage is a power supply.

25. A D/A converter in accordance with claim 13, wherein the first potential voltage is a ground.

26. A D/A converter comprising:
a current generating circuit which is connected to a first node, and which generates a current corresponding to a digital signal;
a first transistor element connected between the first node and a first potential voltage;
a second transistor element which is connected between a second node and the first potential voltage, of which a control terminal is connected to that of the first transistor element, and which is of a same conductive type as the first transistor element;
a first control circuit which uses a bias voltage as one of inputs thereto, and which controls voltages of the control terminals of said first and second transistor elements so that a voltage of said second node becomes substantially equal to that of said first node;
a resistance element, one end of which is connected to a second potential voltage, and which converts a current flowing through said second transistor element into a voltage;
a third transistor element connected between the second node and the other end of said resistance element; and
a second control circuit which uses said bias voltage as one of inputs thereto, and which controls a voltage of a control terminal of said third transistor element so that the voltage of said second node becomes substantially equal to that of said first node.

27. A D/A converter in accordance with claim 26, wherein each of said first and second control circuits is an operational amplifier.

28. A D/A converter in accordance with claim 27, wherein:
said first transistor element is a N-type MOS transistor;
said second transistor element is a N-type MOS transistor; and
said third transistor element is a P-type MOS transistor.

29. A D/A converter in accordance with claim 26, wherein the first potential voltage is a power supply and the second potential voltage is a ground.

30. A D/A converter in accordance with claim 26, wherein the first potential voltage is a ground and the second potential voltage is a power supply.

* * * * *